GRADED IMPURITY PROFILE IN EPITAXIAL FILMS TO IMPROVE INTEGRATED CIRCUIT PREFORMANCE

Filed Feb. 26, 1970

GRAHAM J. ALCOTT
IAN M. BENNETT
GERALD R. SECREST
INVENTORS

BY Alan H. MacPherson

ATTORNEY

United States Patent Office 3,737,347

Patented June 5, 1973

3,737,347

GRADED IMPURITY PROFILE IN EPITAXIAL FILMS TO IMPROVE INTEGRATED CIRCUIT PERFORMANCE

Graham J. Alcott, Los Gatos, Ian M. Bennett, Palo Alto, and Gerald R. Secrest, Redwood City, Calif., assignors to Fairchild Camera and Instrument Corporation, Mountain View, Calif.

Filed Feb. 26, 1970, Ser. No. 14,407

Int. Cl. C23c *13/00;* H01l *7/36, 11/00*

U.S. Cl. 148—17.5 6 Claims

ABSTRACT OF THE DISCLOSURE

In a monolithic silicon integrated circuit having NPN and substrate PNP transistors therein, a substrate has a layer of intrinsic silicon deposited over its surface prior to and as part of growing an epitaxial region or layer. The intrinsic layer enables a narrow PNP width base and a graded junction to be formed incident to the fabrication of the NPN and PNP.

BACKGROUND OF THE INVENTION

Field of the invention

This invention relates to semiconductor integrated circuits and a method for making the same.

Prior art

There has been considerable difficulty encountered in the manufacture of high performance PNP and NPN transistors in the same wafer. In general, the solution, albeit an unhappy one, has been to compromise the PNP transistor performance in order to meet a particular specification for the NPN transistor. One of the reasons for this compromise is that it is now common in the fabrication of NPN transistors to employ a buried layer of N+ type region beneath or adjacent to the epitaxially deopsited N-type layer at least in the portion of the integrated circuit where the NPN transistor is to be formed. Such a construction is shown in U.S. Pat. 3,260,902 issued to E. H. Porter and assigned to the assignee of this invention. This structure, while having numerous advantages, has certain disadvantages when a PNP transistor is formed in the same wafer as the NPN transistor. The main disadvantage arises from the use of a high resistivity substrate necessary to minimize substrate to collector capacitance in combination with the buried N+ type layer to minimize series resistance through the collector and the epitaxial layer of the NPN transistor. The combination of these structural features prevents the formation of a narrow width base (e.g., approximately 2 microns or less) for the PNP transistor as the out diffusion from the buried layer that occurs incident to the formation of the integrated circuit requires a sufficient base width to accommodate this out diffusion. Less out-diffusion occurs incident to the high resistivity P-substance employed as part of the PNP transistor. It can be seen that if the base width was not large enough, the out diffusion from the buried layer would degrade the PN (base collector) junction of the NPN transistor and the $BV_{CBO}$ of the NPN transistor would be substantially lowered. Thus the base width must be large enough to compensate for this out diffusion in the NPN structure. This limits the performance of the PNP transistor making possible only PNP transistors with relatively low betas and relatively poor switching and speed characteristics.

SUMMARY OF THE INVENTION

The invented process includes the step of forming an intrinsic layer of semiconductor material over the substrate prior to forming the epitaxial layer. In simplistic terms, this layer of intrinsic material serves to tend to equalize the out diffusion from an enriched layer and the high resistivity substrate. In addition the intrinsic layer enables a graded junction to be formed via the out diffusion and down diffusion. The tendency to equalize the various out diffusions enables a narrower base to be attained which along with the graded junction provides an integrated circuit having PNP transistors and NPN transistors with an overall superior performance.

The graded base structure offers a reduction in base transit time and thus gives a high frequency performance which is better than that of similarly constructed uniform junction transistors. The transport of injected carriers is largely controlled by both diffusion and drift processes. The graded base structure develops an electric field which enhances the drift component of current.

It should also be noted that the addition of the intrinsic layer over the substrate means that the PNP base width no longer depends on relative concentrations of the epitaxial layer and the substrate. It is now possible to employ higher resistivity substrates which decidedly reduce isolation capacitance. When the improved process is applied to the fabrication of switching circuits, it is possible to obtain PNP transistors with increased $f_T$ and hence circuits with smaller switching time delays (i.e. $f_T$ increases from 50 mHz. to 150 mHz. at $I_c$=0.3 ma. and $V_{ce}$=1.0 volt and switching time delays from around 3 nsec. to less than 1 nsec.).

Other advantages as well as the details of the invention will be readily understood from the detailed description which follows:

DETAILED DESCRIPTION OF THE INVENTION

Figure 1A:
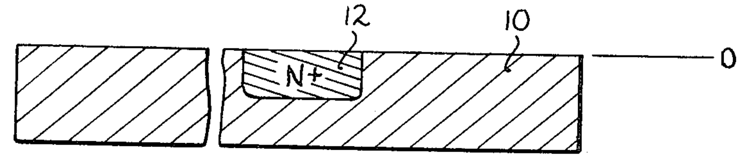
FIGS. 1*a–d* are a series of enlarged somewhat schematic transverse sections illustrating one embodiment of the method of this invention.

Referring to FIGS. 1*a–d*, the integrated circuit is formed in a monocrystalline silicon substrate 10 having a desired impurity therein. The substrate is usually prepared for further processing by well known cleaning and finishing techniques. When the wafer preparation is complete, a pattern of first conductivity type impurity regions such as 12, are formed on substrate 10. In the preferred embodiment of this invention, this first region 12 is an N+ region and is what has heretofore been referred to as the buried layer. The formation of this region is usually accomplished by masking the surface of the substrate with material resistant to diffusion. When the substrate is silicon, silicon dioxide is the preferred mask. Holes are opened in the mask where required by photoengraving processes known in the art. The surface of the substrate is then subjected to a gaseous atmosphere containing the desired impurities. These impurities diffuse into the unmasked portions of the surface of substrate 10. The diffusion time and depth depend upon the resistivity and depth of the pattern desired. The use of this method of forming the impurity pattern, however, is not essential to the invention. Alternatively, the impurity pattern may be deposited on the substrate in any manner as by painting or spraying a slurry or mixture containing the impurity element on the oxides. In the example illustrated here, an N+ type pattern is desired and N-type impurities such as antimony, arsenic or phosphorus are employed. It is, however, within the scope of the invention to employ P-type impurities such as gallium, aluminum, boron or indium. It should be generally recognized throughout that it is possible to reverse the various conductivity types if similar reversals are employed throughout. A choice of a specific impurity often depends upon its diffusion rate. FIG. 1*a* shows the device after the burried layer 12 has been formed.

Figure 1B:
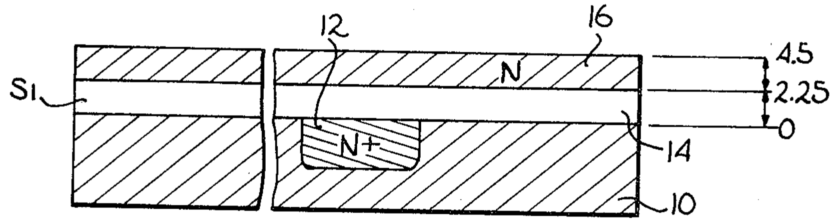
Figure 1C:
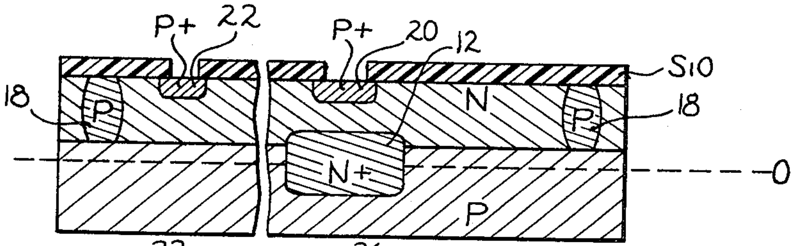

Referring to FIG. 1*b*, an intrinsic layer 14 is now formed on substrate 10. For the purposes of this specification and the claims, the term "intrinsic layer" is intended to include an ideal intrinsic layer as well as monocrystalline semiconductor material having a P-type or N-type impurity wherein either of said impurities are less than approximately 1/10 of the substrate impurity concentration. In the preferred embodiment of the method, the intrinsic layer 14 is epitaxially deposited on substrate 10. Various methods forming this epitaxial layer are known in the art. Certain of these methods are described in Hunter, L. P., Handbook of Semiconductor Electronics, 2nd. ed. Sub. Chapter 7.11 (York, Pa., 1962). It should be understood while it is not shown in FIG. 1*b*, the time and temperature used in the growth of epitaxial layer 14 are often such that impurities in buried layer 12 and substrate 10 diffuse outwardly through the epitaxial layer while it is being grown. Heating causes these impurities to so diffuse. The amount of concurrent diffusion is governed by the time and temperature chosen for epitaxial growth and the diffusion rate of the impurities used. If the surface of the device is to be subsequently oxidized for protection, some diffusion will also occur at that time as is indicated in FIG. 1*c*.

The forming of the intrinsic layer 14 is followed by the formation of a second layer or region 16, having an opposite conductivity type with respect to substrate 10 but the same conductivity type as buried layer 12. In one preferred embodiment of the invention, the layer 16 is epitaxially deposited in precisely the same manner and with the same apparatus as employed to form intrinsic layer 14. For example, a layer 14 and 16, of approximately 4.5 microns, is grown in a single five minute cycle with the control of the epitaxial reactor adjusted so that the N-type dopant is turned on only after two and one-half minutes of growth and during the formation of the final 2.25 microns, that is, during formation of layer 16. The impurity concentration of layer 16 is preferably selected so that there is a starting impurity concentration of greater than approximately $10^{15}$ atoms/cm.$^3$ and preferably $10^{16}$ atoms/cm.$^3$. Substrate 10 typically has a starting concentration of approximately less than $5.0\times10^{15}$ atoms/cm.$^3$. In general, it is understood that an N-region is a region of N-type conductivity having a concentration of N-type impurities from about $10^{15}$ to $7\times10^{18}$ atoms/cm.$^3$. An N+ region has a doping level from about $7\times10^{18}$ up to the solubility limit of the impurity used which in practice may be about $2\times10^{21}$ with arsenic for example.

With intrinsic layer 14 and epitaxial layer 16 formed as shown in FIG. 1*b*, the remaining steps of the process, in general, are conventional, well-known techniques for forming monolithic silicon integrated circuits. In general, the next process steps involve forming a mask for the fabrication of the isolation region, pre-depositing the impurity for the isolation diffusion and diffusing the isolation into substrate to form isolation regions 18. Next, the base mask is formed, the impurity for base fabrication is pre-deposited and the base diffusion is performed, with base region 20 of the NPN transistor resulting. It should be noted that it is possible to simultaneously form the emitter region 22 of the PNP transistor. In this embodiment, this emitter region is, of course, a P+ type region. The device with the isolation regions 18, base 20 and emitter 22 is shown in FIG. 1*c*. It should be noted in FIG. 1*c* that at this point of the process there has been a substantial diffusion from the substrate 10 and buried layer 12 as well as N-type epitaxial layer 16 into the intrinsic layer 14. This diffusion takes place as indicated above during the heatings incident to the various oxidations and diffusions. The oxidations, of course, are performed incident to the fabrication of the various silicon dioxide masks. Typically, the isolation diffusion may extend for a period of 20 minutes at a temperature of 1200° C. while the base diffusion may typically occur in two steps of 1175° C. for 15 minutes and 920° C. for one hour. The mask forming oxidations are generally performed at temperatures ranging at about 900°–1300° C. for a period of one to two hours. The details for various masking procedures and diffusions are disclosed in numerous publications and patents such as Frosch and Derick, Surface Protection and Oxide Masking During Diffusion in Silicon, J. Electro Chem. Soc., vol. 104, pp. 547–552, 1957, and U.S. Pat. 3,018,359 to Gordon E. Moore and Robert N. Noyce assigned to the assignee of this invention.

Figure 1D:
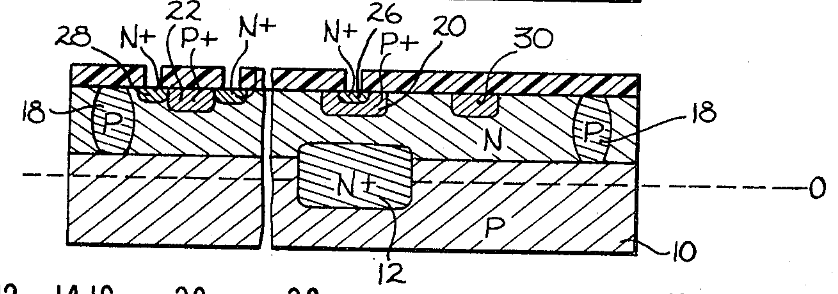

Next, the emitter masks as well as the mask for other regions employing the same conductivity type and concentrations are formed followed by a pre-deposition of the desired impurities such as N+ impurities in this example, which are then diffused to form emitter region 26 and various contact regions 28 and 30, as shown in FIG. 1*d*. These regions are formed by substantially the same general processes as employed to form the isolation and base regions. To complete the device, the various contacts are formed in accordance with a well known technique such as described in U.S. Patent 2,981,877 to Robert N. Noyce assigned to the assignee of this invention.

Figures 2A, 2B:
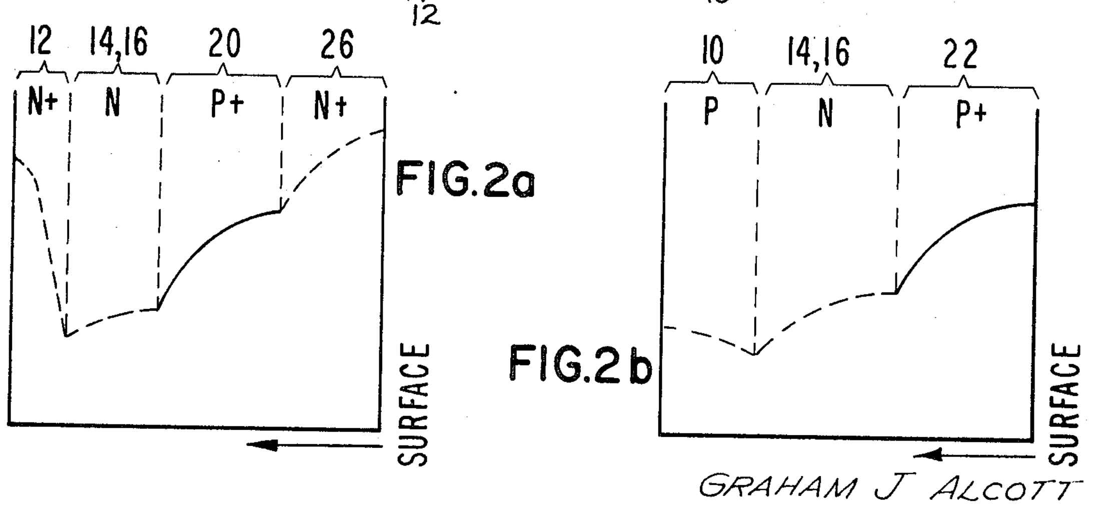
FIG. 2 is a graphical showing of the impurity distribution employing the method of this invention and specific processed conditions.

The completed device which is shown without the contacts in FIG. 1*d*, includes PNP transistor formed by region 22, epitaxial layer 14, 16 and substrate 10, and NPN transistor formed by regions 26, 20 and layer 16. Both the NPN transistor and the PNP transistor have graded base-collector junctions with very narrow base widths. The base width will typically range between $0.5\mu$ to $1.0\mu$ for the NPN transistors and $1.0\mu$ to $2.5\mu$ for the PNP transistors. A typical impurity concentration distribution for device formed by the above described process is shown in FIG. 2A for the NPN and 2B for the PNP transistors.

The PNP transistor may be formed with a beta in excess of 20 and typically within 40 to 60. This is a substantial improvement over prior art integrated circuits employing a single epitaxial layer. The transit times, and consequently switching speed, and high frequency characteristics are considerably improved. For example, the $f_t$ at $I_c$=0.3 milliamp, and $V_{ce}$=1.0 volts in a typical device having the graded junctions and narrow base was measured at higher than 200 mHz. Employing a prior art process and device would result in a characteristic of approximately 60 mHz. The $h_{FE}$ at 0.5 ma. for the same device was measured as 83 while the prior art device showed measurement of 42. In addition, the devices employed in various switching and gate structures, demonstrated particularly low level offset voltages, and lower notch amplitudes as compared with prior art devices.

One final advantage that should be pointed out is that the use of the intrinsic layer over the substrate results in the PNP base width no longer depending upon the relative concentration of the epitaxial layer and the substrate. With this limitation removed, higher substrate resistivities may be employed with reduction in isolation capacitance in excess of 50% possible.

While the above description has been directed primarily to an example wherein an NPN and PNP transistor is employed in the same substrate, the broader aspects of the invention are applicable to constructions where only one type of transistor is employed in a device. It should be noted that both the NPN and PNP transistors have graded thin base regions (and graded base-collector junctions).

We claim:

1. A process for forming a semiconductor device having a graded base and a graded base-collector junction in a wafer of a first conductivity type having a surface, said process comprising:

forming in said wafer a low resistivity first region of opposite conductivity type with respect to said wafer, said first region coming to at least a portion of said surface of said wafer;

depositing a first layer of intrinsic monolithic semiconductor material over at least a portion of said surface of said wafer;

depositing a second layer of monolithic semiconductor material of opposite conductivity type over said first layer, said second layer also possessing a surface, wherein during the formation of said second layer, impurities in said wafer and in said second layer each diffuse into said first layer, and forming a plurality of second regions of said first conductivity type, each of said second regions being at least partially within said second layer and forming a pn junction extending to the surface of said second layer; said plurality of second regions being formed in such a manner that at least one of said second regions is vertically disposed above at least a portion of the first region, and at least another of said second regions is vertically disposed such that no portion of said first region is beneath it, and wherein during formation of said plurality of second regions, additional impurities diffuse from said wafer, said first region, and said second layer into said first layer to form a graded base, and a graded base-collector junction.

2. The process recited in claim 1 wherein all of said regions, layers, and wafer are mono-crystalline silicon.

3. The process recited in claim 2 wherein said first layer and said second layer are epitaxially deposited.

4. The process recited in claim 3 wherein a plurality of devices are formed; and wherein said wafer is of a P-type conductivity.

5. The process recited in claim 4 wherein:

said first regions are N+ type conductivity buried regions of finite size;

said first layer is disposed over substantially all of said surface of said wafer;

said second layer is of N type conductivity and is disposed over substantially all of said first layer; and, said second regions are P type conductivity regions of finite size only certain of which are vertically disposed above said first regions.

6. The process recited in claim 5 including the additional step of forming an N+ type conductivity region within only certain of said second regions and vertically disposed above said first regions whereby NPN are formed, and whereby concomitant diffusions further form the PNP structures within said epitaxial layered wafer.

References Cited

UNITED STATES PATENTS

| | | | |
|---|---|---|---|
| 3,165,811 | 1/1965 | Kleimack et al. | 148—175 X |
| 3,260,902 | 7/1966 | Porter | 317—235 |
| 3,315,096 | 4/1967 | Carlson et al. | 317—235 X |
| 3,327,182 | 6/1967 | Kisinko | 317—235 |
| 3,404,450 | 10/1968 | Karcher | 148—175 X |
| 3,453,504 | 7/1969 | Compton et al. | 317—235 |
| 3,473,977 | 10/1969 | Skouson et al. | 117—106 A |
| 3,506,891 | 4/1970 | Luce | 148—175 X |
| 3,512,056 | 5/1970 | Chu et al. | 317—235 |
| 3,522,164 | 7/1970 | Sumner | 148—175 X |
| 3,449,643 | 6/1969 | Inaizumi | 317—235 |
| 3,660,180 | 5/1972 | Wajda | 148—175 |

OTHER REFERENCES

Chang et al.: "Fabrication of PNP and NPN Transistors in . . . Chip," I.B.M. Tech. Discl. Bull., vol. 11, No. 12, May 1969, pp. 1653–1654.

Vora et al.: "Pin Isolation for Monolithic Integrated Circuits," IEEE Trans. on Electron Devices, vol. ED–15, No. 9, September 1968, pp. 655–659.

Chang et al.: "Fabricating NPN and PNP Transistors in a Single Device," I.B.M. Tech. Discl. Bull., vol. 12, No. 11, April 1970, pp. 1994–1995.

L. DEWAYNE RUTLEDGE, Primary Examiner

W. G. SABA, Assistant Examiner

U.S. Cl. X.R.

117—106 A, 201, 215; 148—175, 191; 317—235 R